United States Patent
Haluska et al.

[11] Patent Number: 5,436,084
[45] Date of Patent: Jul. 25, 1995

[54] ELECTRONIC COATINGS USING FILLED BOROSILAZANES

[75] Inventors: Loren A. Haluska; Keith W. Michael, both of Midland, Mich.

[73] Assignee: Dow Corning Corporation, Midland, Mich.

[21] Appl. No.: 223,297

[22] Filed: Apr. 5, 1994

[51] Int. Cl.⁶ .............................................. B32B 9/00
[52] U.S. Cl. .................................. 428/688; 427/228; 427/377; 427/387; 427/397.7; 428/698; 428/702; 428/704; 437/235; 437/238
[58] Field of Search .......... 427/226, 228, 377, 387, 427/397.7; 437/235, 238; 428/688, 698, 702, 704

[56] References Cited

U.S. PATENT DOCUMENTS

| | | | |
|---|---|---|---|
| 4,482,689 | 11/1984 | Haluska | 528/25 |
| 4,910,173 | 3/1990 | Niebylski | 501/97 |
| 4,973,526 | 11/1990 | Haluska | 428/697 |
| 5,179,048 | 1/1993 | Niebylski | 427/228 X |
| 5,258,229 | 11/1993 | Lum et al. | 427/228 X |

FOREIGN PATENT DOCUMENTS

| | | |
|---|---|---|
| 364323 | 4/1990 | European Pat. Off. |
| 424082 | 4/1991 | European Pat. Off. |
| 221466 | 9/1989 | Japan |
| 52287 | 3/1991 | Japan |
| 3250082 | 11/1991 | Japan |
| 02472 | 2/1993 | WIPO |

*Primary Examiner*—Michael Lusignan
*Attorney, Agent, or Firm*—Roger E. Gobrogge

[57] ABSTRACT

The present invention relates to a method of forming coatings on electronic substrates and the substrates coated thereby. The method comprises applying a coating comprising a borosilazane and a filler on a substrate and heating the coated substrate at a temperature sufficient to convert the borosilazane to a ceramic coating.

20 Claims, No Drawings

ELECTRONIC COATINGS USING FILLED BOROSILAZANES

BACKGROUND OF THE INVENTION

The present invention relates to a method of forming coatings using compositions comprising borosilazanes and fillers. These coatings are useful on a variety of electronic substrates.

The use of borosilazanes to form ceramic coatings is known in the art. For instance, references such as U.S. Pat. Nos. 4,482,689 and 4,910,173 and European Patent Nos. 364,323 and 424,082 teach borosilazanes which can be used to form such coatings. These references, however, do not teach the use of borosilazanes with fillers as coating compositions on electronics.

The use of polysilazanes to form ceramic coatings on electronic devices is also known in the art. For instance, International Publication WO 93/02472 discloses a process for forming a coating on an electronic substrate wherein a solution of a polysilazane resin is applied to an electronic substrate followed by heating the coated substrate in air at a temperature in the range of 150°–800° C. This reference, however, does not describe the use of borosilazane nor the use of fillers within the coating.

Similarly, the use of fillers within ceramic coatings derived from polysilazanes is also known in the art. For instance, Japanese Patent Application Numbers 52287, 221466 and 3250082 describe compositions comprising polysilazanes and fillers. These references, however, do not describe the use of borosilazanes.

U.S. Pat. No. 4,973,526 teaches a method of forming coatings containing silicon, oxygen and boron. The method taught therein comprises mixing hydrogen silsesquioxane resin with a boron oxide precursor, coating an electronic device with the mixture and heating the coated device to ceramify the coating. This reference, however, does not describe the use of borosilazanes nor the incorporation of fillers.

The present inventors have now discovered that useful coatings can be formed from compositions comprising borosilazanes and fillers.

SUMMARY OF THE INVENTION

The present invention relates to a method of forming a coating on an electronic substrate and the substrates coated thereby. The method comprises first applying a composition comprising a borosilazane and a filler on the electronic substrate. The coated substrate is then heated at a temperature sufficient to convert the composition to a ceramic coating.

DETAILED DESCRIPTION OF THE INVENTION

The present invention is based on the discovery that desirable protective coatings can be formed on electronic substrates from compositions comprising borosilazanes and fillers. Coatings derived therefrom are thicker (eg., >40 microns) than those derived from borosilazanes (eg., <2 microns), they can have a variety of electrical properties depending on the filler and they can be crack and pore-free.

Because of the above advantages, these coatings are particularly valuable on electronic substrates. Such coatings could serve, for example, as passivation or dielectric coatings, interlevel dielectric layers, doped dielectric layers to produce transistor like devices, pigment loaded binder systems containing silicon to produce capacitor and capacitor like devices, multilayer devices, 3-D devices, silicon on insulator devices, coatings for superconductors, super lattice devices, conductive coatings, magnetic coatings, tamperproof coatings and the like.

As used in the present invention, the expression "ceramic coating" is used to describe the hard borosilicate containing coating obtained after heating the borosilazane—filler composition. In addition to the filler, this coating contains Si-O and B-O bonds which may or may not be fully free of residual carbon, hydrogen, and/or nitrogen but which are otherwise ceramic in character; The expression "filler" is used to describe a finely divided solid phase which is distributed within the borosilazane and the final ceramic coating. The expression "electronic substrate" is meant to include, but is not limited to, electronic devices or electronic circuits such as silicon based devices, gallium arsenide based devices, focal plane arrays, opto-electronic devices, photovoltaic cells and optical devices.

In the process of the present invention a ceramic coating is formed on a substrate by a process which comprises applying a coating composition comprising a borosilazane and a filler onto the substrate and then heating the coated substrate at a temperature sufficient to convert the borosilazane to a ceramic.

The polyborosilazanes (or borosilazanes) useful in this invention are generally well known in the art and their structure is not particularly critical. The boron content of these polymers is likewise generally not critical and, thus, can vary over a wide range (eg., 0.1–50 wt %). Generally, the backbone of the borosilazanes of this invention contain Si-B, Si-N, and B-N bonds with the remaining valences of these atoms filed by groups independently selected from the group consisting of hydrogen, alkyl radicals containing 1 to 20 carbon atoms such as methyl, ethyl, propyl, etc., aryl radicals such as phenyl, and alkenyl radicals such as vinyl. Preferred borosilazanes are those in which there is no carbon in the repeating units of the polymer, i.e., there may be carbon in the polymeric endcaps.

Examples of specific borosilazanes include, for instance, those described in U.S. Pat. No. 4,910,173 granted to Niebylski, those described in U.S. Pat. No. 5,169,908 granted to Zank, those described by Seyferth et al. in European Patent Application 424,082, those described by Haluska in U.S. Pat. No. 4,482,689, those described by Seyferth et al., J. Am. Ceram. Soc. 73, 2131–2133 (1990), those described by Noth, B. Anorg. Chem. Org. Chem., 16(9), 618–21, (1961), those described by Araud et al. in European Patent No. 364,323, those described by Funayama et al. in U.S. Pat. No. 5,030,744, those described by Takamizawa et al. in U.S. Pat. No. 4,604,367, all of which are incorporated herein by reference in their entirety.

The method for preparing such compounds is likewise known in the art and described in the above references. Examples of such methods, however, comprises (1) reacting a boron trihalide with a silazane oligomer such as $(RSi(NH)_{1.5})_x$ or $((CH_3)_3Si)_2NH$, wherein R is selected from the group consisting of hydrogen, a hydrocarbon radical and a substituted hydrocarbon radical and x is an integer of 2–20; (2) reacting an organoborazine with an organopolysilane; and (3) the reaction of a boron compound such as a borane complex, boroxine, boron alkoxides, borazines, etc. with a polysilazane.

A particularly preferred polymer comprises the boron modified hydropolysilazane polymers of Zank in U.S. Pat. No. 5,169,908. These polymers are produced by a process which comprises reacting a hydrosilazane polymer with a borane complex or diborane. In a more preferred embodiment of the invention the hydropolysilazane used in the reaction of Zank is produced by the reaction of trichlorosilane and hexamethyldisilazane as described in U.S. Pat. No. 4,540,803.

Although several polymers are specifically described above, nearly any borosilazane may be used in the process described herein.

The fillers used herein are known in the art for use in coatings with other polymers. These included various inorganic and organic fillers, especially inorganic fillers, in a variety of morphologies including, but not limited to powders, particles, flakes, microballoons, filaments and the like. Examples of inorganic fillers include synthetic and natural materials such as the oxides, nitrides, borides and carbides of various metals and non-metals such as glass, alumina, silica, silicon monoxide, zirconium oxide, titanium dioxide, tantalum oxide, niobium oxide, zinc oxide, tungsten oxide, ruthenium oxide, silicon nitride, aluminum nitride, titanium diboride, silicon carbide, boron carbide and boron nitride; calcium carbonate; high dielectric constant fillers (eg >12) such as the titanate, niobate or tungstate salts of metals such as strontium, zirconium, barium, lead, lanthanium, iron, zinc, and magnesium including, for example, barium titanate, potassium titanate, lead niobate, lithium titanate, strontium titanate, barium strontium titanate, lead lanthanium zirconium titanate, lead zirconium titanate and lead tungstate; radiopaque materials (materials which prevent penetration by radiation) such as the insoluble salts of barium, lead, silver, gold, cadmium, antimony, tin, palladium, strontium, tungsten and bismuth including, for example, salts such as carbonates, sulfates and oxides (eg., barium sulfate); optically opaque fillers such as inorganic pigments, silicon nitride powder, silicon carbide powder, aluminum nitride powder, silica, and alumina; tamperproof materials (materials which render heat on oxidation) such as magnesium, iron, tin, silicon and zinc; magnetic materials such as carbon alloys, ferrites, iron carbonyls and alloys of metals such as iron, manganese, cobalt, nickel, copper, titanium, tungsten, vanadium, molybdenum, magnesium, aluminum, chromium, zirconium, lead, silicon and zinc including, for example, $Fe_2O_3$, MnZn, NiZn, CuZn, and other ferrite materials; metals which produce thermally or electrically conductive coatings such as gold, silver, copper, aluminum, nickel, zinc, chromium, cobalt and the like; precipitated diatomite, aluminum silicate or other silicates, pigments, phosphors, wollostonite, mica, kaolin, clay, talc and the like. Also, some organic materials such as cellulose, polyamides, phenol resins and the like may be used.

The preferred fillers to be used herein depend on the intended use for the coating. For instance, if the coating is to be used as an interlevel dielectric, a material such as silica or alumina may be desirable so that the coating has a low dielectric constant (DK) (eg., less than 8). Similarly, if a coating having a high DK is desired (eg., greater than 12), a material such as barium titantate or lead niobate may be desirable. Similarly, if an opaque coating is desired, an optically or radiopaque material may be desired. Likewise, if a conductive coating is desired, a filler such as gold or silver may be used.

The number average particle size and shape of the above fillers can vary over a wide range depending on factors such as the type of filler, the desired coating thickness, etc. Since the coatings are generally less than about 500 microns thick, particle sizes less than this are generally used. Preferred particles have a number average size less than about 50 microns and the most preferred particles have a number average size in the range of submicron to 10 microns.

The amount of filler used in the present invention can also be varied over a wide range depending, for example, on the quality and electrical characteristics desired in the final coating. Generally, however, the fillers are used in an amount less than about 90 weight percent based on the weight of the polysilazane to insure that enough resin is present to bind the filler. Obviously, smaller amounts of fillers (eg., 1-5 wt %) can also be used.

If desired, other materials may also be present in the coating composition. For instance, it is within the scope of the present invention to use a material which modifies the surface of the filler for better adhesion. Such materials can include, for example, silanes such as glycidoxypropyltrimethoxysilane, mercaptopropyltrimethoxysilane, and vinyltriacetoxysilane. Similarly, it is within the scope of the invention to include suspending agents such as cellulose, clay, fumed silica, stearates and the like in the coating composition. These and other optional components are known to those skilled in the art.

According to the process of the invention, the borosilazane, filler and any optional components are applied to the surface of a substrate. This can be accomplished in any manner, but a preferred method involves dissolving the borosilazane in a solvent and dispersing the filler and any optional components therein. This dispersion is then applied to the surface of the substrate. Various facilitating measures such as stirring and/or heating may be used to dissolve or disperse the borosilazane and filler and create a more uniform application material. Solvents which may be used include any agent or mixture of agents which will dissolve or disperse the borosilazane and filler to form a liquid mixture without affecting the resultant coating. These solvents can include, for example, aromatic hydrocarbons such as benzene or toluene, alkanes such as n-heptane or dodecane, ketones, esters, glycol ethers, or cyclic dimethylpolysiloxanes, in an amount sufficient to dissolve/disperse the above materials to the concentration desired for application. Generally, enough of the above solvent is used to form a 0.1–80 weight percent mixture, preferably 1–50 wt. percent.

If a liquid method is used, the liquid mixture comprising the borosilazane, filler, solvent, and, any optional components is then coated onto the substrate. The method of coating can be, but is not limited to, spin coating, dip coating, spray coating or flow coating. Similarly, the coating can be selectively deposited by a masking or silk screening process. Other equivalent means, however, are also deemed to be within the scope of this invention.

The solvent is then allowed to evaporate from the coated substrate resulting in the deposition of the borosilazane and filler coating. Any suitable means of evaporation may be used such as simple air drying by exposure to an ambient environment, by the application of a vacuum or mild heat (eg., less than 50° C.) or during the early stages of the heat treatment. It is to be noted that when spin coating is used, the additional drying period is minimized as the spinning drives off the solvent.

Although the above described methods primarily focus on using a liquid approach, one skilled in the art would recognize that other equivalent means would also function herein and are contemplated to be within the scope of this invention.

The borosilazane and filler coating is then typically converted to the ceramic by heating it to a sufficient temperature. Generally, the temperature is in the range of about 50° to about 1000° C. depending on the pyrolysis atmosphere. Preferred temperatures are in the range of about 100° to about 800° C. and more preferably 150°–500° C. Heating is generally conducted for a time sufficient to ceramify, generally up to about 6 hours, with less than about 3 hours being preferred. Other methods of conversion (such as radiation) are, however, also contemplated herein.

The above heating may be conducted at any effective atmospheric pressure from vacuum to superatmospheric and under any effective oxidizing or non-oxidizing gaseous environment such as those comprising air, $O_2$, an inert gas ($N_2$, etc.), ammonia, amines, moisture, $N_2O$ etc.

Any method of heating such as the use of a convection oven, rapid thermal processing, hot plate, or radiant or microwave energy is generally functional herein. The rate of heating, moreover, is also not critical, but it is most practical and preferred to heat as rapidly as possible.

By the above methods a ceramic coating is produced on the substrate. The coating is generally a borosilicate matrix containing the filler. The thickness of the coating can vary over a wide range (eg., up to 500 microns) as described above. These coatings smooth the irregular surfaces of various substrates, they are relatively defect free, they have excellent adhesive properties and they have a variety of electrical properties (eg, low DK and high DK). As such, they are particularly useful for a variety of electronic applications such as protective layers (eg., passivation, dielectric or tamperproof), magnetic coatings or conductive layers.

Additional coatings may be applied over these coatings if desired. These can include, for example, $SiO_2$ coatings, $SiO_2$/ceramic oxide layers, silicon containing coatings, silicon carbon containing coatings, silicon nitrogen containing coatings, silicon oxygen nitrogen coatings, silicon nitrogen carbon containing coatings and/or diamond like carbon coatings. Methods for the application of such coatings are known in the art and many are described in U.S. Pat. No. 4,756,977, which is incorporated herein by reference. An especially preferred coating is silicon carbide applied by the chemical vapor deposition of silacyclobutane. This process is described in U.S. Pat. No. 5,011,706 which is incorporated herein by reference.

The following non-limiting examples are included so that one skilled in the art may more readily understand the invention.

EXAMPLE 1

6 g plasma alumina with a number average particle size of 6 micrometers, 2 g of borohydridopolysilazane (50.01 wt % solids in xylene—contains 10 wt % B) made by the method of Zank in U.S. Pat. No. 5,169,908, 0.4 g glycidoxypropyltrimethoxysilane and 1.5 g xylene were mixed. A biohomogenizer was used to completely disperse the materials. The coating composition was applied to the surface of an 7.5×15 cm aluminum panel using a 100 micrometer drawdown bar. The coating was allowed to dry for 3 hours. The coated panel was then heated at 550° C. for 1 hour. The coating was 85 micrometers thick and was crack-free at 1000×.

EXAMPLE 2

6 g plasma alumina with a number average particle size of 6 micrometers, 3.53 g of borohydridopolysilazane (56.5 wt % solids in xylene—contains 5 wt % B) made by the method of Zank in U.S. Pat. No. 5,169,908, 0.4 g glycidoxypropyltrimethoxysilane and 0.5 g xylene were mixed. A biohomogenizer was used to completely disperse the materials. The coating composition was applied to the surface of an 7.5×15 cm aluminum panel using a 100 micrometer drawdown bar. The coating was allowed to dry for 3 hours. The coated panel was then heated at 550° C. for 1 hour. The coating was 64 micrometers thick and was crack-free at 1000×.

What is claimed is:

1. A method of forming a coating on an electronic substrate comprising:
   applying a coating composition comprising a borosilazane and a filler onto an electronic substrate; and
   converting the coating composition on the substrate into a borosilicate containing ceramic coating.

2. The method of claim 1 wherein the coating composition is applied to the substrate by a process which comprises coating the substrate with a liquid mixture comprising a solvent, the borosilazane and the filler and then evaporating the solvent.

3. The method of claim 2 wherein said liquid mixture is coated onto the substrate by spray coating, dip coating, flow coating, spin coating or silk screening.

4. The method of claim 1 wherein the coating composition on the substrate is converted into the borosilicate containing ceramic coating by heating at a temperature in the range of between about 50° C. and about 800° C. for less than about 3 hours.

5. The method of claim 4 wherein the coating composition on the substrate is heated in an environment containing one or more components selected from the group consisting of air, $O_2$, oxygen plasma, an inert gas, ammonia, amines, moisture, and $N_2O$.

6. The method of claim 1 wherein the coating composition also contains a material which modifies the surface of the filler.

7. The method of claim 1 wherein the coating composition also contains a suspending agent.

8. The method of claim 1 wherein the filler is in a form selected from the group consisting of powders, particles, flakes and microballoons.

9. The method of claim 1 wherein the filler has a particle size less than about 500 microns.

10. The method of claim 1 wherein the filler is present in the coating composition in an amount less than about 90 weight percent.

11. The method of claim 1 wherein the borosilicate containing ceramic coating has a dielectric constant less than 8.

12. The method of claim 1 wherein the borosilicate containing ceramic coating has a dielectric constant greater than 12.

13. The method of claim 1 wherein the filler is selected from the group consisting of the oxides, nitrides, borides and carbides of a metal or non-metal.

14. The method of claim 12 wherein the filler is selected from the group consisting of the titanate, niobate or tungstate salts of a metal.

15. The method of claim 1 wherein the filler is a radiopaque filler.

16. The method of claim 1 wherein the filler is an optically opaque filler.

17. The method of claim 1 wherein the filler is a tamperproof filler.

18. The method of claim 1 wherein the filler is a magnetic filler.

19. The method of claim 1 wherein the filler is a conductive filler.

20. The substrate coated by the method of claim 1.

* * * * *